(12) United States Patent
Kim et al.

(10) Patent No.: US 12,710,839 B2
(45) Date of Patent: Aug. 18, 2026

(54) ORGANIC LIGHT EMITTING DISPLAY DEVICE WITH AN ELECTRODE EXTENDING STRUCTURE

(71) Applicant: LG DISPLAY CO., LTD., Seoul (KR)

(72) Inventors: Dongyul Kim, Paju-si (KR); Jieun Lee, Paju-si (KR)

( * ) Notice: Subject to any disclaimer, the term of this patent is extended or adjusted under 35 U.S.C. 154(b) by 449 days.

(21) Appl. No.: 17/488,625

(22) Filed: Sep. 29, 2021

(65) Prior Publication Data

US 2022/0102449 A1 Mar. 31, 2022

(30) Foreign Application Priority Data

Sep. 29, 2020 (KR) ........................ 10-2020-0127086

(51) Int. Cl.
*G06F 3/041* (2006.01)
*H10K 59/122* (2023.01)
(Continued)

(52) U.S. Cl.
CPC ........ *G06F 3/04164* (2019.05); *G06F 3/0412* (2013.01); *H10K 59/122* (2023.02);
(Continued)

(58) Field of Classification Search
CPC ...... H10K 59/122; H10K 59/40; H10K 50/82; H10K 50/844; H10K 59/8722;
(Continued)

(56) References Cited

U.S. PATENT DOCUMENTS

2006/0125385 A1* 6/2006 Lu .......................... H10K 71/00 313/506
2014/0183501 A1* 7/2014 Kim ................ H10K 59/80516 438/34
(Continued)

FOREIGN PATENT DOCUMENTS

KR 20100090067 A 8/2010
KR 20110138787 A 12/2011
(Continued)

OTHER PUBLICATIONS

Office Action in Korean Appln. No. 10-2020-0127086, mailed on May 12, 2025, 16 pages (with English translation).
(Continued)

*Primary Examiner* — Norman D Richards
*Assistant Examiner* — Sean Ayers Winters

(57) ABSTRACT

An organic light emitting display device includes a substrate over which a plurality of first to third subpixels is disposed, each having a light-emitting portion and a non-light-emitting portion surrounding the light-emitting portion, a first electrode disposed in the light-emitting portion of each of the first to third subpixels, a bank having an inverse taper disposed between the first to third subpixels in the non-light-emitting portion, a structure located to contact at least one lateral surface of the bank on the first electrode, a light emitting layer located on the first electrode, the bank and the structure, and having a separation portion in a lateral portion of the bank, and a second electrode located on the light emitting layer.

20 Claims, 7 Drawing Sheets

(51) Int. Cl.
*H10K 59/40* (2023.01)
*H10K 59/80* (2023.01)

(52) U.S. Cl.
CPC ......... *H10K 59/40* (2023.02); *H10K 59/8722* (2023.02); *H10K 59/8051* (2023.02); *H10K 59/80521* (2023.02); *H10K 59/873* (2023.02)

(58) Field of Classification Search
CPC ........... H10K 59/80521; H10K 59/873; H10K 59/8051; G06F 3/0412; G06F 3/04164
See application file for complete search history.

(56) References Cited

U.S. PATENT DOCUMENTS

| | | | | |
|---|---|---|---|---|
| 2015/0115235 | A1* | 4/2015 | Lee | H10K 50/844 257/40 |
| 2015/0188077 | A1* | 7/2015 | Kim | H10K 59/80522 438/46 |
| 2016/0118630 | A1* | 4/2016 | Choi | B41M 5/46 156/230 |
| 2017/0365812 | A1* | 12/2017 | Choung | H10K 50/15 |
| 2018/0211979 | A1* | 7/2018 | Lee | H10K 59/878 |
| 2019/0067617 | A1* | 2/2019 | Tanaka | H10K 59/30 |
| 2019/0165063 | A1* | 5/2019 | Lee | H10K 50/822 |
| 2019/0237514 | A1* | 8/2019 | Tsukamoto | G09F 9/30 |
| 2019/0339818 | A1* | 11/2019 | Rhe | G06F 3/0443 |
| 2020/0235172 | A1* | 7/2020 | Lee | H10K 50/15 |

FOREIGN PATENT DOCUMENTS

| | | | |
|---|---|---|---|
| KR | 20150027486 | A | 3/2015 |
| KR | 20160026364 | A | 3/2016 |
| KR | 20170128741 | A | 11/2017 |
| KR | 20190047554 | A | 5/2019 |
| KR | 20190057749 | A | 5/2019 |
| KR | 20190069166 | A | 6/2019 |
| KR | 20200039264 | A | 4/2020 |
| KR | 20200091059 | A | 7/2020 |

OTHER PUBLICATIONS

Notice of Allowance in Korean Appln. No. 10-2020-0127086, mailed on Jan. 13, 2026, 5 pages (with English translation).

* cited by examiner

ORGANIC LIGHT EMITTING DISPLAY DEVICE WITH AN ELECTRODE EXTENDING STRUCTURE

CROSS-REFERENCE TO RELATED APPLICATION

This application claims the priority benefit of Korean Patent Application No. 10-2020-0127086, filed on Sep. 29, 2020, which is hereby incorporated herein by reference in its entirety.

BACKGROUND

Field of the Disclosure

The present disclosure relates to organic light emitting display devices, and more specifically to an organic light emitting display device for preventing a lateral leakage current by allowing an organic material, which is disposed after a bank and a structure are disposed, to be disconnected in the vicinity of the bank.

Description of the Background

Image display devices configured to display various information or data on a display screen act as a core device in the information and communication era. The display devices become thinner and lighter and are being developed to have high performance while being portable. Among various types of display devices, there are growing needs for display devices that can be manufactured to have a relatively light weight and a relatively thin package. Display devices having a self-emissive property are advantageous in terms of less power consumption as low-voltage driving is available, and have a short response time, high luminous efficiency, a wide viewing angle, and a high contrast ratio. Thus, these display devices have been developed as next generation displays. These display devices can display images by stimulating a plurality of subpixels arranged in a matrix form. Each of the plurality of subpixels includes a light emitting element and a plurality of transistors that independently drives the light emitting element.

A liquid crystal display (LCD) device, a quantum dot (QD) display device, a field emission display (FED) device, an organic light emitting diode (OLED) device, and the like are examples of such display devices.

Among these display devices, the organic light emitting display device has become more attractive for displaying more vibrant colors and implementing a compact package without a need for a separate light source, and has advantages of a short response time, a high contrast ratio, high luminous efficiency, luminance, a wide viewing angle, and the like by using a self-emissive organic light emitting diode (OLED).

Such an organic light emitting display device includes organic light emitting elements each independently driven in each subpixel. Each organic light emitting element includes a first driving electrode, a second driving electrode, and a plurality of organic layers, such as a hole injection layer, a hole transport layer, a light emitting layer, an electron transport layer, and the like, which is disposed between the first driving electrode and the second driving electrode. In order to prevent external moisture and oxygen from penetrating the organic light emitting element and degrading the reliability of the organic light emitting display device, an encapsulation portion can be provided that is formed of an insulating film of multiple layers including at least one organic film and/or at least one inorganic film covering the organic light emitting element.

Further, from an anode, the hole injection layer, the hole transport layer, the organic light emitting layer, and the electron transport layer in the order are disposed in the plurality of organic layers. Among these layers, the organic light emitting layer substantially functions to emit light when holes and electrons are combined to form excitons and corresponding energy falls to a ground state, and the other layers function to help transport holes or electrons to the organic light emitting layer.

Further, to produce colored light, the organic light emitting display device includes multiple subpixels, such as red, green, and blue subpixels, and organic light emitting layers corresponding to the respective colors of these subpixels are disposed in respective subpixels. The organic light emitting layer is generally disposed by a deposition method using a shadow mask.

In the case of a shadow mask having a large area, there is a probability of sagging because of its weight, and this leads a manufacturing yield to be decreased when it is used several times. Because of this, organic layers except for the light emitting layer are seamlessly commonly disposed in each subpixel without the shadow mask.

However, in structures to which a common layer is applied as in a recent attempt, due to the common layer commonly disposed in subpixels, there is observed a lateral leakage current flowing to a lateral portion through the flat continuous common layer.

FIG. 1 a plan view and a cross-sectional view illustrating a phenomenon in which a lateral leakage current is caused in a typical organic light emitting display device.

As shown in FIG. 1 as an example of typical organic light emitting display devices, a first electrode 141, a bank overlapping with at least one edge of the first electrode 141 and defining a light-emitting portion, a light emitting layer 142 covering the first electrode 141 and the bank 130, and a second electrode 143 in the order are disposed in each subpixel.

A hole injection layer and a hole transport layer are continually formed in the light emitting layer 142, and the light emitting layer 142 may further include an organic light emitting layer and an electron transport layer disposed on the hole transport layer.

As shown in FIG. 1, when driven with a low gray scale, a phenomenon is observed in which even an adjacent subpixel emits light. Even when a voltage is applied between first and second electrodes of only a specific subpixel for causing a pure colored light to be emitted through this subpixel, the phenomenon of allowing even an adjacent subpixel to emit light is caused due to a current leaking into a lateral portion through a common layer, as well as a vertical electric field between the anode and cathode of the specific subpixel.

Such a lateral leakage current is clearly visually recognized, especially in low gray scale expressions. This is because, when a current flows through common organic layers common to the sub-pixels due to a lateral leakage current flowing horizontally in a sub-pixel, the light-emitting of an adjacent sub-pixel due to the lateral leakage current acts in a similar way to the turn-on of the adjacent sub-pixel in an off-state, In this case, color purity may be deteriorated, and it is difficult to express pure gray scales.

This is because a similar light-emitting effect is produced even by a small leakage current in one or more subpixels driven with a relatively low driving voltage among subpixels.

In particular, in this situation, a desired color display cannot be performed normally as mixed colors occur in low gray scale expressions due to a phenomenon of emitting light with other colors caused by such a lateral leakage current.

Further, the greater the conductivity of the common organic layer used as the common layer, the greater the influence of the lateral leakage current on an adjacent subpixel may be.

SUMMARY

To address the above issues, aspects described herein relate to organic light emitting display devices for preventing a lateral leakage current by allowing an organic material, which is disposed after a bank and a structure are disposed, to be disconnected in the vicinity of the bank.

In accordance with an aspect of the present disclosure, an organic light emitting display device is provided that includes a substrate over which a plurality of first to third subpixels is disposed, each having a light-emitting portion and a non-light-emitting portion surrounding the light-emitting portion, a first electrode disposed in the light-emitting portion of each of the first to third subpixels, a bank having an inverse taper disposed between the first to third subpixels in the non-light-emitting portion, a structure located to contact at least one lateral surface of the bank on the first electrode, a light emitting layer located on the first electrode, the bank and the structure, and having a separation portion in a lateral portion of the bank, and a second electrode located on the light emitting layer.

In accordance with another aspect of the present disclosure, an organic light emitting display device is provided that includes a substrate over which a plurality of first to third subpixels is disposed in an active area (or display area) surrounded by a non-active area (or non-display area), a bank having an inverse taper disposed between the first to third subpixels, a first structure located to contact at least one lateral surface of the bank, a dam located in the non-active area, and a touch line intersecting the dam in at least a part of the dam.

In addition to the aspects above described, other aspects, the present disclosure and resulted advantages will be described below, and variations thereof will become apparent to those skilled in the art from the following detailed description.

In accordance with the present disclosure, it is possible to provide an organic light emitting display device capable of reducing or correcting a mixed-color defect caused by such a leakage current by increasing paths that allow the leakage current to flow between adjacent subpixels.

Further, in accordance with the present disclosure, the structure of an inverse taper bank is more advantageous in a high-resolution model and has an advantage in implementing a thin structure or package, and it is possible to provide an organic light emitting display device in which peeling defects are reduced or corrected by increasing the adhesion of a light emitting element.

Effects of the present disclosure are not limited to the above description, more various effects will be apparent in following description.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
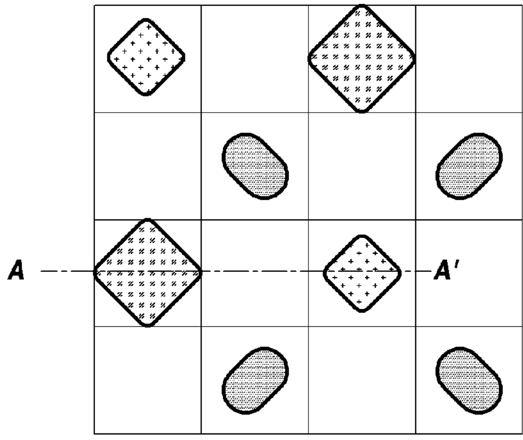
FIG. 1 is a plan view and a cross-sectional view illustrating how a lateral leakage current is caused in a typical organic light emitting display device.
Figure 1:
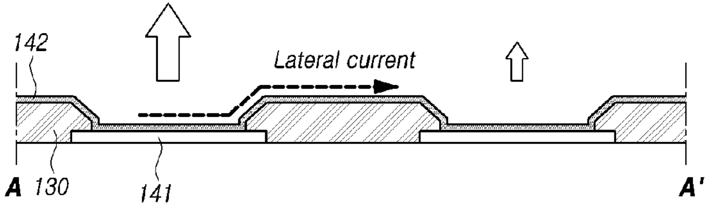

The advantages and features of the present disclosure and methods of achieving the same will be apparent by referring to aspects of the present disclosure as described below in detail with reference to the accompanying drawings. It should be noted that the present disclosure is not limited to aspects set forth below and may be implemented in various different forms. Thus, aspects of the present disclosure are provided for specifically describing the present disclosure and for specifically informing those skilled in the art to which it pertains of the scope of the present disclosure, and the scope of the present disclosure is defined only by the scope of the appended claims.

In addition, the shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some aspects of the present disclosure rather unclear.

The terms, such as "including," "having," "containing," "comprising of," "consist of," or the like, used herein are generally intended to allow other components to be added unless the terms are used with the term "only". Singular forms used herein are intended to include plural forms unless the context clearly indicates otherwise.

In interpreting any elements or features of the aspects herein, it should be considered that any dimensions and relative sizes of layers, areas and regions include a tolerance or error range even when a specific description is not conducted.

Spatially relative terms, such as, "on", "over, "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as 'directly', "only" are used.

Time relative terms, such as "after, For example," "subsequent to," "next," "before," or the like, used herein to describe a temporal relationship between events, operations, or the like are generally intended to include events, cases, operations, or the like that do not occur consecutively unless the terms, such as 'directly' "immediately," or the like, are used.

When the terms, such as "first," "second," or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

It should be understood that the term "at least one" used herein may include all combinations obtained by combining one or more associated elements. For example, "at least one of a first item, a second item and a third item" may include all combinations obtained by two or more of the first item, the second item and the third item, as well as each of the first item, the second item and the third item.

The elements or features of various exemplary aspects of the present disclosure can be partially or entirely bonded to or combined with each other and can be interlocked and operated in technically various ways as can be fully understood by a person having ordinary skill in the art, and the various exemplary aspects can be carried out independently of or in association with each other.

Hereinafter, an example of a display device in accordance with aspects of the present disclosure will be discussed in detail with reference to accompanying drawings. In denoting elements of the drawings by reference numerals, the same elements will be referenced by the same reference numerals although the elements are illustrated in different drawings. Scale of the components shown in the accompanying drawings is illustrated for convenience of description and may be different from actual scale; thus, aspects of the present disclosure are not limited to the scale shown in the drawings.

Figure 2:
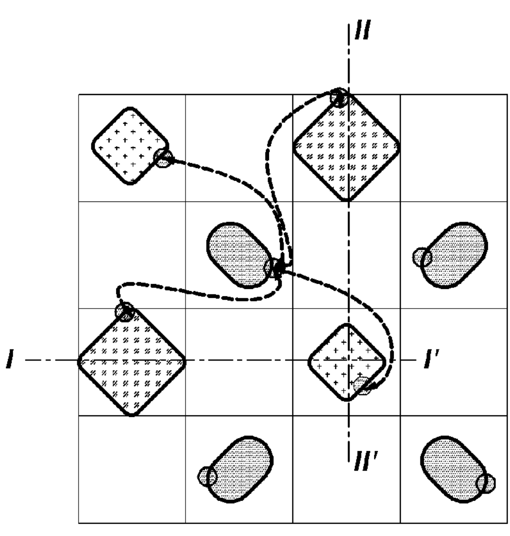
FIG. 2 illustrates an active area in which a plurality of subpixels is disposed in an organic light emitting display device according to aspects of the present disclosure.

FIG. 2 illustrates an active area in which a plurality of subpixels is disposed in an organic light emitting display device according to aspects of the present disclosure.

Referring to FIG. 2, the plurality of subpixels is disposed in the active area. The plurality of subpixels includes first to third subpixels each emitting light corresponding to one of red, green, and blue. When needed according to the design of display devices, a subpixel emitting white light may be further included.

Each of the first to third subpixels is a light emitting element 140 emitting light corresponding to one of red, green, and blue. A portion in which a light emitting layer 142 is located in the light emitting element 140 may be a light-emitting portion, and a portion surrounding the light-emitting portion may be a non-light-emitting portion.

A bank 130 may be disposed between adjacent first to third subpixels, and be located in the non-light-emitting portion of each of the first to third subpixels.

A structure 150 may be disposed in at least one lateral surface of the bank 130, and be located so that a distance between the adjacent first to third subpixels can be most spaced apart Detailed discussions on the bank 130 and the structure 150 will be given below with reference to FIGS. 3 and 4.

Figure 3:
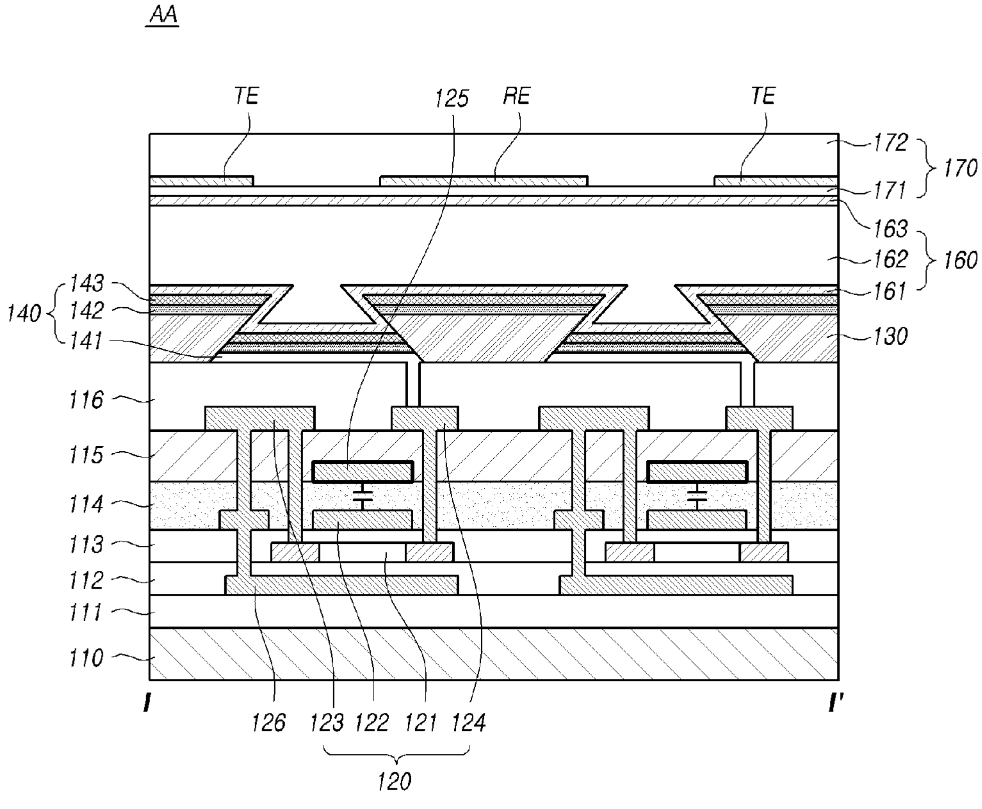
FIG. 3 is a cross-sectional view taken along with line I-I' of FIG. 2.

FIG. 3 is a cross-sectional view taken along with line I-I' of FIG. 2.

Referring to FIG. 3, an organic light emitting device according to an aspect of the present disclosure includes a substrate 110, a buffer layer 111, a BSM 126, an active buffer 112, a first insulating layer 113, a second insulating layer 114, a third insulating layer 115, a fourth insulating layer 116, a bank 130, an organic light emitting element 140, and a thin film transistor 120 located on the substrate 110.

The thin film transistor 120 may be an oxide semiconductor thin film transistor having an active layer formed of an oxide semiconductor material. Since the oxide semiconductor material has a band gap greater than a silicon material, electrons cannot jump a band gap in an off state, and as a result, an off-current is small. Accordingly, the oxide semiconductor thin film transistor is suitable for a switching thin film transistor remaining a short on-time and a long off-time. Further, since the off-current is small, an auxiliary capacity may be reduced, and as a result, the oxide semiconductor thin film transistor is suitable for a high-resolution display device.

Referring to FIG. 3, the buffer layer 111 is located on the substrate 110. The thin film transistor 120 is located on the buffer layer 111 in order to drive the light emitting element 140 in an active area AA over the substrate 110. The thin film transistor 120 includes an active layer 121, a gate electrode 122, a source electrode 123 and a drain electrode 124. The thin film transistor 120 is a driving thin film transistor, and has a top-gate structure in which the gate electrode 122 is located over the active layer 121.

The substrate 110 is a base element to support various elements of the organic light emitting display device, and may be formed of an insulating material. For example, the substrate 110 may be formed of glass or a plastic material such as polyimide.

Referring to FIG. 3, the buffer layer 111 is located on all or at least a part of the top surface of the substrate 110. The buffer layer 111 may be made up of a single layer including silicon nitride (SiNx) or silicon oxide (SiOx), or multiple layers including silicon nitride (SiNx) and silicon oxide (SiOx). The buffer layer 111 serves to improve adhesion between layers disposed on the buffer layer 111 and the substrate 110, and serves to prevent an alkali component, and the like leaking out of the substrate 110. It should be noted that the buffer layer 111 is not an essential element, and thus, may be omitted according to the type and material of the substrate 110, and the structure and type of the thin film transistor, and the like.

Referring to FIG. 3, the buffer layer 126 is located on the BSM 126. The BSM 126 may be disposed to overlap with the active layer 121 of the thin film transistor 120 on the buffer layer 111, and a width of the BSM 126 may be greater than or equal to a width of the active layer 121 of the thin film transistor 120 in the cross section view. The BSM 126 may be formed of various metal materials, and in the case of the organic light emitting display device illustrated in FIG. 3, the BSM 126 may be floated. That is, a voltage may not be applied to the BSM 126.

Referring to FIG. 3, the active buffer 112 is located on the BSM 126. Further, the source electrode 121 of the thin film transistor 120 is connected to the BSM 126 through a contact hole. According to this, the same voltage as a voltage applied to the source electrode 123 of the thin film transistor 120 is applied to the BSM 126. Although the BSM 126 is connected to the source electrode 123 of the thin film transistor 120 in FIG. 3, aspects of the present disclosure are not limited thereto. The BSM 126 may be connected to the gate electrode 122 of the thin film transistor 120 or the drain electrode 124 of the thin film transistor 120, and the same voltage as a voltage applied to the gate electrode 122 of the thin film transistor 120, or the same voltage as a voltage applied to the drain electrode 124 of the thin film transistor 120, may be applied to the BSM 126. In another example, a desired constant voltage may be applied to the BSM 126 through a line to which a separate constant voltage is applied.

Referring to FIG. 3, the active layer 121 of the thin film transistor 120 is located on the active buffer 112 in the active area AA. The active layer 121 is an area in which a channel is formed when the thin film transistor 120 is driven. The active layer 121 is formed of an oxide semiconductor.

Referring to FIG. 3, the first insulating layer 113 is located on the active layer 121. The first insulating layer 113 may be made up of a single layer including silicon nitride (SiNx) or silicon oxide (SiOx), or multiple layers including silicon nitride (SiNx) and/or silicon oxide (SiOx). The first insulating layer 113 has a contact hole for allowing the source electrode 123 and the drain electrode 124 to contact respective source and drain regions of the active layer 121. As shown in FIG. 3, the first insulating layer 113 may be disposed to overlap with all or at least a part of the substrate 110, and/or patterned to have the same width as the gate electrode 122. However, aspects of the present disclosure are not limited thereto.

Referring to FIG. 3, the second insulating layer 114 is located on the gate electrode 122. The second insulating layer 114 may be made up of a single layer including silicon nitride (SiNx) or silicon oxide (SiOx), or multiple layers including silicon nitride (SiNx) and/or silicon oxide (SiOx). The second insulating layer 114 has a contact hole for allowing the source electrode 123 and the drain electrode 124 to contact respective source and drain regions of the active layer 121. As shown in FIG. 3, the second insulating layer 114 may be disposed to overlap with all or at least a part of the substrate 110, or disposed only in the active area AA. However, aspects of the present disclosure are not limited thereto.

Referring to FIG. 3, the metal layer 125 is located on the second insulating layer 114. The metal layer 125 is located to overlap with the gate electrode 122, and thus, capacitive coupling may be formed between the metal layer 125 and the gate electrode 122.

Referring to FIG. 3, the third insulating layer 115 is located on the metal layer 125. The third insulating layer 115 may block hydrogen diffused from an upper portion of the thin film transistor 120. The third insulating layer 115 may be formed of an organic material or an inorganic material.

Referring to FIG. 3, the source electrode and the drain electrode 124 are located on the third insulating layer 115. The source electrode and the drain electrode 124 are electrically connected to the active layer 121 through a contact hole of the first to third insulating layer (113, 114 and 115). The source electrode and the drain electrode 124 may be formed of one, or an alloy of two or more, of various metal materials, for example, molybdenum (Mo), aluminum (Al), chromium (Cr), gold (Au), titanium (Ti), nickel (Ni), neodymium (Nd) and copper (Cu), or be made up of multiple layers including two or more thereof.

FIG. 3 illustrates only one driving thin film transistor among a plurality of thin film transistors to be included in the organic light emitting display device; however, aspects of the present disclosure are not limited thereto. For example, other thin film transistors, such as a sensing thin film transistor, a switching thin film transistor, and the like, may be included in the organic light emitting display device. Further, although the thin film transistor 120 having a coplanar structure has been described herein; however, aspects of the present disclosure are not limited thereto. For example, a thin film transistor having other structures such as a staggered structure, and the like may be implemented.

Referring to FIG. 3, the fourth insulating layer 116 is located on the third insulating layer 115 in all or at least a part of each of the active area AA and a non-active area NA. A contact hole for exposing the source electrode 123 of the thin film transistor 120 is formed in the fourth insulating layer 116. A first electrode 141 may be connected to one (in the case of FIG. 3, drain electrode 124) of the source and drain electrodes of the thin film transistor 120 through the contact hole of the fourth insulating layer 116.

Referring to FIG. 3, a light emitting element 140 is located on the fourth insulating layer 116. The light emitting element 140 disposed on the fourth insulating layer 116 includes the first electrode 141 electrically connected to the source electrode 123 of the thin film transistor 120, a light emitting layer 142 located on the first electrode 141, and a source electrode 143 disposed on the light emitting layer 142.

A region in which the light emitting layer 142 of the light emitting element 140 is located may be a light-emitting portion, and a region surrounding the light-emitting portion may be a non-light-emitting portion. The bank 130 may be located on at least a part of the non-light-emitting portion.

The first electrode 141 may be formed of a conductive material having a high work function to provide holes to the light emitting layer 142. The first electrode 141 may be formed of a transparent conductive material, such as indium tin oxide (ITO), indium zinc oxide (IZO), indium tin zinc oxide (ITZO), and the like.

As described above, since the organic light emitting display device is a top-emission-type electroluminescent display device, the first electrode 141 can include a reflective layer for reflecting light emitted from the light emitting layer 142 toward the second electrode 143 and a transparent conducting layer for providing holes to the light emitting layer. In this case, the first electrode 141 may include only the transparent conducting layer, and the reflective layer may be defined as a separate element from the first electrode 141.

FIG. 3 illustrates that the first electrode 141 is electrically connected to the source electrode 123 of the thin film transistor 120 through the contact hole; however, aspects of the present disclosure are not limited thereto. For example, the first electrode 141 may be electrically connected to the drain electrode 124 of the thin film transistor 120 through a contact hole according to a type of the thin film transistor, a design scheme of a driving circuit, and the like.

The light emitting layer 142 is a layer for emitting a light with a specific color, and may include one of a red light emitting layer, a green light emitting layer, and a blue light emitting layer. In another example, a white light emitting layer may be included in the light emitting layer 142. The light emitting layer 142 may further include other various layers, such as a hole injection layer, a hole transport layer, an electron transport layer, and the like. The light emitting layer 142 may be a common layer commonly disposed across a plurality of subpixels.

The second electrode 143 is located on the light emitting layer 142. The second electrode 143 can provide electrons to the light emitting layer 142. The second electrode 143 may be formed of indium tin oxide (ITO), indium zinc oxide (IZO), indium tin zinc oxide (ITZO), and zinc oxide (ZnO), and tin oxide (TO)-based transparent conductive oxide or an ytterbium (Yb) alloy. In another example, the second electrode 143 may be formed of a metal material.

Referring to FIG. 3, the bank 130 is located on the first electrode 141 and the fourth insulating layer 116. FIG. 3 illustrates that the bank 130 covers a part of the first electrode 141 of the light emitting element 140; in another aspect, the bank 130 may cover a part of the non-active area NA. The bank 130 can be located to separate adjacent first to third subpixels in the active area AA. The bank 130 may be formed of an organic material. For example, the bank 130 may be formed of polyimide, acryl, or benzocyclobutene (BCB)-based resin; however, aspects of the present disclosure are not limited thereto.

Each of a plurality of subpixels in the active area AA may have a light-emitting portion and a non-light-emitting portion. The bank 130 located in the non-light-emitting portion may be formed to have an inverse taper between adjacent first to third subpixels.

That is, since the bank 130 has the inverse taper in the plurality of subpixels, the light emitting layer 142 formed as a common layer may be formed to be spaced apart between a light-emitting portion and a non-light-emitting portion. Accordingly, as parts of the light emitting layer 142 are spaced apart from one another, a current leaking to a lateral portion through the common layer may be reduced, and when only a specific subpixel of the first to third subpixels is driven to emit light, it is possible to reduce or correct a phenomenon in which even an adjacent subpixel emits light due to a resulted leakage current. More detailed discussions on the bank 130 will be given below with reference to FIG. 4.

Referring to FIG. 3, an encapsulation portion 160 may be located on the second electrode 143.

The encapsulation portion 160 can prevent the penetration of oxygen and moisture from the outside in order to prevent a light emitting material and an electrode material from being oxidized. When the organic light emitting element is exposed to moisture or oxygen, a pixel shrinkage phenomenon in which a light emitting region is reduced may be represented, or a dark spot may be generated in the light emitting region. The encapsulation portion 160 may be an inorganic film formed of glass, metal, aluminum oxide (AlOx), or a silicon (Si)-based material, or have a structure in which an organic film and an inorganic film are alternately stacked. The inorganic film serves to prevent the penetration of oxygen and moisture, and the organic film serves to enable the surface of the inorganic film to have a uniform height. When the encapsulation portion is made up of multiple thin film layers, it is possible to enable traveling paths of moisture or oxygen to be elongated and complicated, and such elongated and complicated traveling paths lead the moisture or oxygen not to penetrate the organic light emitting element. Herein, the encapsulation portion 160 including a first encapsulation layer 161, a second encapsulation layer 162 and a third encapsulation layer 163 is described as an example of possible encapsulation portions.

The first encapsulation layer 161 is disposed over the substrate 110 on which the second electrode 143 is disposed. The third encapsulation layer 163 is disposed over the substrate 110 on which the second encapsulation layer 162, and is formed to surround, together with the first encapsulation layer 161, all or at least a part of each of a top surface, a bottom surface, and/or at least one lateral surface of the second encapsulation layer 162. The first encapsulation layer 161 and the third encapsulation layer 163 can minimize or prevent moisture or oxygen from the outside from penetrating into the light emitting element 140. The first encapsulation layer 161 and the third encapsulation layer 163 may be formed of a low-temperature-deposition-enabled inorganic insulating material, such as silicon nitride (SiNx), silicon oxide (SiOx), silicon oxynitride (SiON), or aluminum oxide (Al2O3). As the first encapsulation layer 161 and the third encapsulation layer 163 can be deposited in a low temperature atmosphere, when a deposition process for the first encapsulation layer 161 and the third encapsulation layer 163 is performed, it is possible to prevent the light emitting element 140 vulnerable to a high temperature atmosphere from being damaged.

The second encapsulation layer 162 serves as a buffer to relieve stress between layers, and serves to flatten a distance, or a step difference, between layers. The second encapsulation layer 162 may be formed of a non-photosensitive organic insulating material, such as acryl resin, epoxy resin, phenolic resin, polyamide resin, polyimide resin, and polyethylene or silicon oxycarbon (SiOC), or a photosensitive organic insulating material, such as photoacrylic, over the substrate 110 over which the first encapsulation layer 161 is disposed; however, aspects of the present disclosure are not limited thereto. The second encapsulation layer 162 is formed using an inkjet method, a dam (Dam in FIG. 5) may be disposed to prevent diffusion of the second encapsulation layer 162 of a liquid state to an edge of the substrate 110. The dam DAM may be disposed closer to the edge of the substrate 110 than the second encapsulation layer 162. By the dam DAM, the second encapsulation layer 162 can be prevent from diffusing to a pad area in which a conductive pad disposed in an outermost edge of the substrate 110 is disposed.

Referring to FIG. 3, in the organic light emitting display device according to aspects herein, a touch sensing layer 170 including first and second touch electrode TE and RE, a touch line (in FIG. 5, TL), and the like may be disposed on the encapsulation portion 160.

Such a structure in which the touch sensing layer 170 is disposed on the encapsulation portion 160 is sometimes referred to as a Touch On Encapsulation Layer (TOE) structure.

Referring to FIG. 3, a buffer layer 171 may be disposed to cover the encapsulation portion 160 on the third encapsulation layer 163 included in the encapsulation portion 160. The buffer layer 171 may be made up of an inorganic film or an organic film. When the buffer layer 171 is made up of an inorganic film, the buffer layer 171 may be made up of a silicon oxide film (SiOx), a silicon nitride film (SiNx), or multiple layers thereof. When the buffer layer 171 is made up of an organic film, plasma treatment on the buffer layer 171 may be performed to roughen the surface roughness of the buffer layer 171. In this case, an area of the buffer layer 171 contacting the first and second touch electrodes TE and RE may be increased; thus, interfacial adhesion between the buffer layer 171 and the first and second touch electrodes TE and RE may increase.

Although the buffer layer 171 is disposed between the encapsulation portion 160 and the first and second touch electrodes TE and RE, however, aspects of the present disclosure are not limited thereto. For example, at least one of the first and second touch electrodes TE and RE may directly contact the third encapsulation layer 163 included in the encapsulation portion 160.

The first and second touch electrodes TE and RE may be made up of a single layer formed of one, or an alloy of two or more, of molybdenum (Mo), aluminum (Al), chromium (Cr), gold (Au), titanium (Ti), nickel (Ni), neodymium (Nd), and copper, or multiple layers formed of an alloy, or alloys, of two or more thereof.

A touch insulating layer 172 disposed on the first and second touch electrodes TE and RE can serve to protect the first and second touch electrodes TE and RE, and the first and second touch electrodes TE and RE may be disposed to overlap with the bank 130 to prevent an opening area of a subpixel from being reduced.

Figure 4:
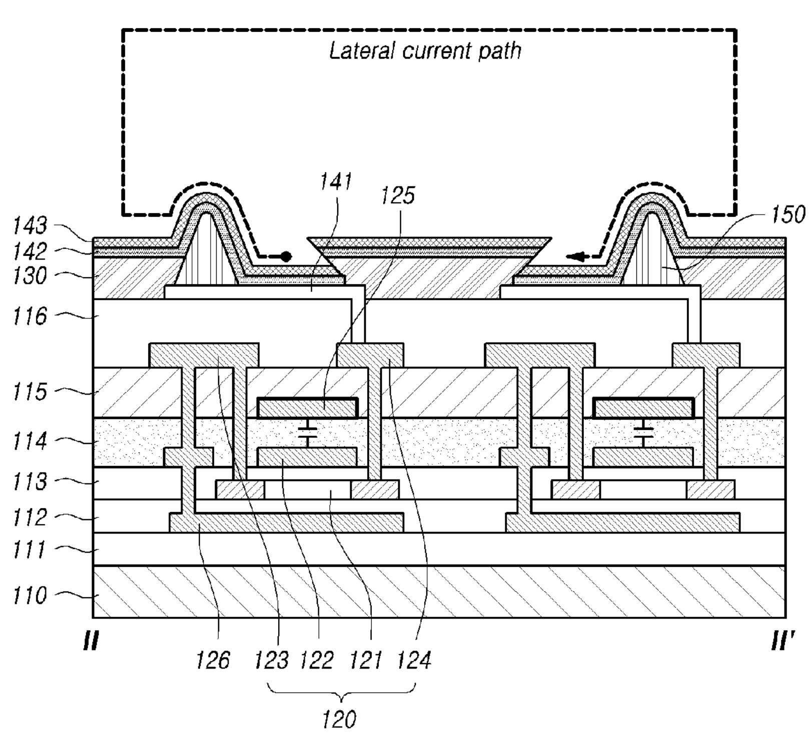
FIG. 4 is a cross-sectional view taken along with line II-II' of FIG. 2.

FIG. 4 is a cross-sectional view taken along with line II-II' of FIG. 2.

Referring to FIG. 4, an area in which the thin film transistor 120 is disposed over the substrate 110 is substantially equal to that of FIG. 3; reference is made to discussions related to FIG. 3. Hereinafter, discussions related to a bank 130 and a light emitting element 140 different from those of FIG. 3 will be given with reference to FIG. 4.

Referring to FIG. 4, a first electrode 141 may be located in a light-emitting portion of each of a plurality of subpixels in the active area, and a bank 130 may be located in a non-light-emitting portion. The bank 130 may be formed to have an inverse taper between adjacent first to third subpixels.

Referring to FIG. 4, a structure 150 may be located on at least a part of the first electrode 141. The structure 150 may be disposed to contact at least one lateral surface of the bank 130. Specifically, the structure 150 is formed to contact the bank 150 in at least one lateral surface of the bank 130 formed to have the inverse taper between the first to third subpixels of the plurality of subpixels, and in this situation, the structure 150 is formed to have a taper. Thus, a light emitting layer 142 is formed without being disconnected on the structure 150, and as a result, can be electrically connected to a first electrode 141.

In other words, a light-emitting portion and a non-light-emitting portion of the light emitting layer 142 formed as a common layer are connected only in a region in which the structure 150 is located, and as a result, a path of a low-level driving voltage EVSS may be formed. Further, as the light-emitting portion and the non-light-emitting portion of the light emitting layer 142 are formed to be spaced apart from each other in the at least one lateral surface of the bank 130 in which the structure 150 is not formed, a current leaking to the lateral portion through the common layer may be reduce or prevented, and as a result, when only a specific subpixel of the first to third subpixels is driven to emit light, it is possible to reduce or correct a phenomenon, i.e. a light emitting defect, in which even an adjacent subpixel emits light due to a resulted leakage current.

Further, the structure 150 may be formed to overlap with the bank 130, and thus, a part of the structure may be located on the bank 130.

The structure 150 may be formed of an organic material. For example, the structure 150 may be formed of polyimide, acryl, or benzocyclobutene (BCB)-based resin; however, aspects of the present disclosure are not limited thereto.

The structure 150 may be formed of a conductive inorganic material. For example, the structure 150 may be formed of a metallic material having a low resistance component, and be electrically connected to the first electrode 141 to reduce resistance.

The structure 150 may be formed of the same material as the bank 130 after the bank 130 is formed, or the structure 150 may be formed of a conductive material and be formed before the bank 130.

Referring to FIG. 4, a height of the structure 150 may be greater than or equal to that of the bank 130.

Specifically, in the case of the typical organic light emitting display device, when a bank 130 is formed to have a taper, a spacer with an inverse taper has been formed on the bank to correct a leakage current. In this case, to obtain a space for forming the spacer with the inverse taper, it is necessary to form a separate space having a height greater than the spacer with the inverse taper, resulting in a larger thickness.

In contrast, in the aspect herein, when the bank 130 with the inverse taper is formed, and the structure 150 is formed to contact at least one lateral surface of the bank 130, a height of the structure 150 may be implemented on the order of a few micrometers; therefore, the structure 150 may be formed to have the same height as the bank 130. Accordingly, this structure has an advantage of implementing a thin structure or package.

Further, as each of a plurality of subpixels may be surrounded by the bank 130 with the inverse taper, since a light emitting layer 142 and a second electrode 143 are disposed without being disconnected only through a location in which the structure 150 contacts one lateral surface of the bank 130, it is possible to reduce or correct a mixed-color defect by increasing paths through which leakage currents flow between adjacent subpixels, comparing with a situation in which the bank 130 is formed to have a taper.

Further, as higher the resolution of a display device is, smaller a distance between adjacent subpixels is, and although a leakage current flowing through the light emitting layer 142 that is a common layer becomes greater, the structure of the bank 130 with the inverse taper allows a contact region of the common layer to be minimized, Therefore, this structure according to the aspects herein is more advantageous for a high-resolution model, and it is possible to reduce or correct peeling defects of the light emitting element 140 by increasing the adhesion of the light emitting element 140.

Figure 5:
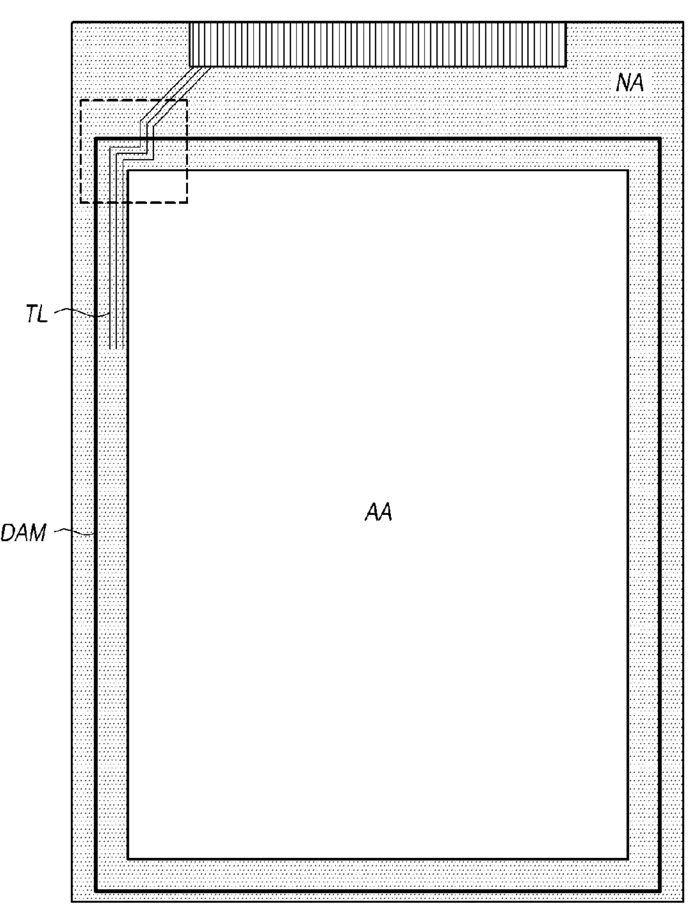
FIG. 5 is a plan view of an organic light emitting display device according to aspects of the present disclosure.

FIG. 5 is a plan view of an organic light emitting display device according to aspects of the present disclosure.

Referring to FIG. 5, an organic light emitting display device according to aspects herein includes an active area AA and a non-active area NA surrounding the active area AA.

A plurality of subpixels may be located on the active area AA, and the plurality of subpixels may be first to third subpixels for each emitting light corresponding to one of red, green, and blue. When needed according to the design of display devices, a subpixel emitting white light may be further included.

The non-active area NA may include a pad area in which a conductive pad is located for providing a driving signal from the outside to the plurality of subpixels located in the active area AA, one or more touch lines TL, a dam DAM, and the like.

When at least one of first to third encapsulation layers (161, 162 and 163) of an encapsulation portion 160 is formed using an inkjet method, the dam DAM may be disposed to surround the active area AA in the non-active area NA in order to prevent the encapsulation portion 160 in the liquid state from diffusing toward an edge of a substrate 110. The dam DAM may be disposed closer to the edge of the substrate 110 than the encapsulation portion 160. By the dam DAM, the encapsulation portion 160 can be prevent from diffusing to the pad area in which the conductive pad disposed in an outermost edge of the substrate 110 is disposed.

Although the dam DAM is designed to prevent the encapsulation portion 160 from diffusing, when the encapsulation portion 160 is formed to exceed a height of the dam during a manufacturing process, a part of an organic layer, or an organic material, of the encapsulation portion 160 may be exposed to the outside, and thus, this may allow moisture and/or oxygen to easily penetrate inside of a light emitting element. Accordingly, to prevent this, at least two or more dams Dam may be disposed.

In addition, the dam DAM may be formed of the same material as at least one of first to fourth insulating layers (113, 114, 115, and 116) of the active area AA, or formed of the same material as a bank 130. In a similar manner to the display area AA, the bank 130 may be formed to have an inverse taper in the non-active area NA.

The touch lines TL may contact at least a part of the conductive pad, and carry touch signals to first and second touch electrodes TE and RE of a touch sensing layer 170. As the touch lines TL are connected to the conductive pad and the first and second electrodes TE and RE of the touch sensing layer 170, thus, the touch lines TL may be disposed to intersect the dam DAM in at least a part of the dam DAM.

Referring to FIG. 5, a square dotted line is an area in which the dam and the touch lines TL intersect each other. When the dam DAM includes the same material as the bank 130 with the inverse taper, there is a probability that the touch line may be disconnected in the intersection area. Accordingly, a structure 150 may be formed to prevent the touch line TL from being disconnected in the intersection area of the dam DAM and the touch line TL.

Figure 6:
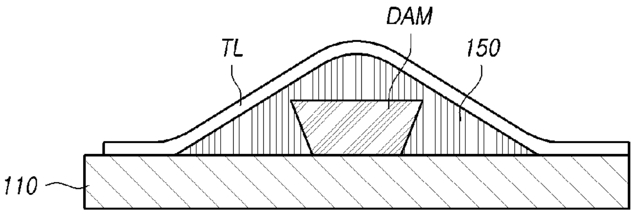
FIG. 6 is a cross-sectional view illustrating a first aspect of the intersection area in FIG. 5.
Figure 7:
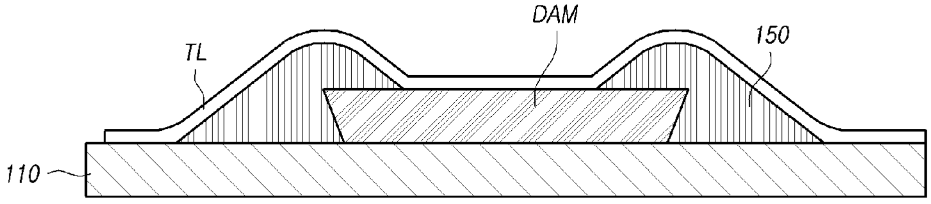
FIG. 7 is a cross-sectional view illustrating a second aspect of an intersection area in FIG. 5.

FIG. 6 is a cross-sectional view illustrating a first aspect of the intersection area in FIG. 5, and FIG. 7 is a cross-sectional view illustrating a second aspect thereof.

Referring to FIG. 6, when a dam with a small width is formed in the intersection area, the structure 150 may be formed to cover all of a top surface and both lateral surfaces of the dam DAM. As a result, a touch line TL may be disposed on the structure 150. As the structure 150 is formed to have a taper shape, differently from the dam with an inverse taper shape, the touch line TL may not be disconnected and can intersect the dam DAM through an upper portion of the structure 150.

Referring to FIG. 7, when a dam with a large width is formed in the intersection area, the structure 150 may be formed to contact both lateral surfaces of the dam DAM. As a result, a touch line TL may be formed to contact at least a part of a top surface of the dam DAM through the structure 150. As the structure 150 is formed to have a taper, and contacts both lateral surfaces of the dam with an inverse taper shape, the touch line TL may not be disconnected and can intersect the dam DAM through an upper portion of the structure 150.

When the bank 130 with an inverse taper is formed in an area in which the touch line runs except for the intersection area of the dam DAM and the touch line TL, the touch line TL can be prevented from being disconnected through the structure 150 with the taper shape formed to cover all of a top surface and both lateral surfaces of the bank 130, or formed to contact the both lateral surfaces.

The structure 150 contacting both lateral surfaces of the dam DAM or the bank 130 with the inverse taper shape may overlap with the dam DAM or the bank 130 with the inverse taper shape, and at least a part of the structure 150 may be disposed on the dam DAM or the bank 130 with the inverse taper shape.

A height of the structure 150 may be greater than or equal to that of the dam DAM or the bank 130 with the inverse taper shape. When the structure 150 is formed to cover all of the dam DAM or the bank 130 with the inverse taper shape, a height of the structure 150 may be greater than that of the dam DAM or the bank 130 with the inverse taper shape. Further, when the dam DAM or the bank 130 with the inverse taper shape is formed to have the inverse taper, and the structure 150 is formed to contact both lateral surfaces of the dam DAM or the bank 130 with the inverse taper shape, a height of the structure 150 may be implemented on the order of a few micrometers; therefore, the structure 150 may be formed to have the same height as the dam DAM or the bank 130 with the inverse taper shape. Accordingly, this structure has an advantage of enabling a thin structure or package.

The display device according to the aspects herein can be described as follows.

A display device such as an organic light emitting display device according to aspects of the present disclosure is provided that includes a substrate over which a plurality of first to third subpixels is disposed, each having a light-emitting portion and a non-light-emitting portion surrounding the light-emitting portion, a first electrode disposed in the light-emitting portion of each of the first to third subpixels, a bank having an inverse taper disposed between the first to third subpixels in the non-light-emitting portion, a structure located to contact at least one lateral surface of the bank on the first electrode, a light emitting layer located on the first electrode, the bank and the structure, and having a separation portion in at least one lateral portion of the bank, and a second electrode located on the light emitting layer.

In the display device according to aspects of the present disclosure, a light emitting layer may contact an upper portion and one or more lateral portions of a structure, and be electrically connected to a first electrode.

In the display device according to aspects of the present disclosure, the structure may be formed of the same material as the bank.

In the display device according to aspects of the present disclosure, the structure may be formed of a conductive material.

In the display device according to aspects of the present disclosure, at least a part of the structure may be disposed to overlap with the bank.

The display device according to aspects of the present disclosure may further include an encapsulation portion covering all, or at least a part, of a surface of a second electrode, and a touch sensor located on the encapsulation portion.

In the display device according to aspects of the present disclosure, the encapsulation portion may flatten the unevenness of the bank and the structure.

In the display device according to aspects of the present disclosure, a touch driving signal may be applied to a touch sensing layer through a touch line.

A display device such as an organic light emitting display device according to aspects of the present disclosure is provided that includes a substrate over which a plurality of first to third subpixels is disposed in an active area surrounded by a non-active area, a bank having an inverse taper disposed between the first to third subpixels, a first structure located to contact at least one lateral surface of the bank, a dam located in the non-active area, and a touch line intersecting the dam in at least a part of the dam.

In the display device according to aspects of the present disclosure, the dam may include the same material as the bank, and have an inverse taper.

The display device according to aspects of the present disclosure may further include a second structure contacting at least one lateral surface of the dam.

In the display device according to aspects of the present disclosure, the second structure may be located between the dam and the touch line.

In the display device according to aspects of the present disclosure, the second structure may overlap with at least a part of the dam.

In the display device according to aspects of the present disclosure, the second structure may contact all, or at least a part, of a top surface and at least one lateral surface of the dam.

In the display device according to aspects of the present disclosure, all of the first structure, the second structure, and the bank may have the same material.

The discussions given above and accompanying drawings are merely exemplary in nature and are not intended to limit the disclosure or its application. It should be noted that various modifications and variations such as combination, separation, substitution, and changes of configurations in the described examples and aspects will be readily apparent to those skilled in the art, without departing from the scope of the aspects and examples of present disclosure. Although the exemplary aspects have been described for illustrative purposes, a person skilled in the art will appreciate that various modifications and applications are possible without departing from the essential characteristics of the present disclosure. For example, the specific components of the exemplary aspects may be variously modified. The scope of protection of the present disclosure is to be construed according to the claims, and all technical ideas within the scope of the claims should be interpreted as being included in the scope of the present disclosure.

What is claimed is:

1. An organic light emitting display device comprising:
a substrate over which a plurality of first to third subpixels is disposed, each subpixel having a light-emitting portion and a non-light-emitting portion surrounding the light-emitting portion;
a first electrode disposed in the light-emitting portion of each of the first to third subpixels;
a first bank having a lateral inclined surface tapered toward the substrate and disposed between two adjacent subpixels of the first to third subpixels in the non-light-emitting portion;
an electrode extending structure located directly on the first electrode and contacting the lateral inclined surface of the first bank on the first electrode;
a light emitting layer located directly on the first electrode, the first bank and the electrode extending structure, and having a discontinuity in a lateral portion of a second bank; and
a second electrode located on the light emitting layer,
wherein the first electrode is disposed closer to the substrate than the second electrode, and the second electrode is disposed further away from the substrate than the light emitting layer,
wherein the electrode extending structure contacts the first electrode, and continuously extends along (i) the lateral inclined surface of the first bank tapered toward the substrate and (ii) a partial lateral inclined surface of the light emitting layer,
wherein an edge of the lateral inclined surface of the first bank tapered toward the substrate and an edge of the partial lateral inclined surface of the light emitting layer directly contact each other, and
wherein the electrode extending structure directly contacts both a top surface of the first electrode and a bottom surface of light emitting layer such that the electrode extending structure does not contact top and bottom surfaces of the second electrode.

2. The organic light emitting display device according to claim 1, wherein the light emitting layer contacts an upper portion and at least one lateral portion of the electrode extending structure and the light emitting layer is electrically connected to the first electrode.

3. The organic light emitting display device according to claim 1, wherein the electrode extending structure is formed of a same material as the first bank.

4. The organic light emitting display device according to claim 1, wherein the electrode extending structure is formed of a conductive material.

5. The organic light emitting display device according to claim 1, wherein a part of the electrode extending structure is disposed to overlap with the first bank.

6. The organic light emitting display device according to claim 1, further comprising:
an encapsulation portion covering all of a surface of the second electrode; and
a touch sensing layer located on the encapsulation portion.

7. The organic light emitting display device according to claim 6, wherein the encapsulation portion flattens unevenness of the first bank and the electrode extending structure.

8. The organic light emitting display device according to claim 6, wherein the touch sensing layer receives a touch driving signal through a touch line.

9. The organic light emitting display device according to claim 1, wherein the light emitting layer laterally extends across a top surface of the first bank.

10. The organic light emitting display device according to claim 1, wherein the second electrode laterally extends across a top surface of the first bank in contact with the light emitting layer.

11. The organic light emitting display device according to claim 1, wherein the light emitting layer disposed on the second bank at least partially overlaps the light emitting layer on the first electrode at the discontinuity.

12. The organic light emitting display device according to claim 1, wherein the light emitting layer is continuous over the first electrode, the first bank, and the electrode extending structure, and
wherein the second electrode extends from the discontinuity to the first bank.

13. An organic light emitting display device comprising:
a substrate over which a plurality of first to third subpixels is disposed in an active area surrounded by a non-active area;
a first bank having a lateral inclined surface tapered toward the substrate and disposed between two adjacent subpixels of the first to third subpixels;
an electrode extending structure located directly on a first electrode and contacting the lateral inclined surface of the first bank;
a light emitting layer located directly on the first electrode, the first bank and the electrode extending structure;
a dam located in the non-active area; and
a touch line contacting at least a part of the dam,
wherein the electrode extending structure contacts the first electrode, and continuously extends along (i) the lateral inclined surface of the first bank tapered toward the substrate and (ii) a partial lateral inclined surface of the light emitting layer,
wherein an edge of the lateral inclined surface of the first bank tapered toward the substrate and an edge of the partial lateral inclined surface of the light emitting layer directly contact each other, wherein the first electrode is disposed closer to the substrate than a second electrode, and the second electrode is disposed further away from the substrate than the light emitting layer, and wherein the electrode extending structure directly contacts both a top surface of the first electrode and a bottom surface of light emitting layer such that the electrode extending structure does not contact top and bottom surfaces of the second electrode.

14. The organic light emitting display device according to claim 13, wherein the dam is formed of a same material as the first bank and has an inverse taper shape.

15. The organic light emitting display device according to claim 14, further comprising a second structure contacting at least one lateral surface of the dam.

16. The organic light emitting display device according to claim 15, wherein the second structure is located between the dam and the touch line.

17. The organic light emitting display device according to claim 16, wherein the second structure overlaps with the at least a part of the dam.

18. The organic light emitting display device according to claim 16, wherein the second structure contacts all of a top surface and at least one of both lateral surfaces of the dam.

19. The organic light emitting display device according to claim 16, wherein the electrode extending structure, the second structure and the first bank have a same material.

20. The organic light emitting display device according to claim 13, wherein the light emitting layer laterally extends across a top surface of the first bank.

* * * * *